United States Patent
Appen et al.

(10) Patent No.: US 6,970,006 B2
(45) Date of Patent: Nov. 29, 2005

(54) APPARATUS FOR THE AUTOMATED TESTING, CALIBRATION AND CHARACTERIZATION OF TEST ADAPTERS

(75) Inventors: Stephan Appen, München (DE); Michael Hübner, Schönau (DE); Michael Kund, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/965,513

(22) Filed: Oct. 14, 2004

(65) Prior Publication Data

US 2005/0046412 A1 Mar. 3, 2005

Related U.S. Application Data

(63) Continuation of application No. 09/931,686, filed on Aug. 16, 2001, now abandoned.

(30) Foreign Application Priority Data

Aug. 16, 2000 (DE) .............................. 100 39 928

(51) Int. Cl.⁷ ............................................ G01R 31/02
(52) U.S. Cl. .................... 324/758; 324/754; 324/158.1
(58) Field of Search .............................. 324/754–758, 324/761, 537, 158.1

(56) References Cited

U.S. PATENT DOCUMENTS 4,471,298 A    9/1984  Frohlich
4,677,474 A    6/1987  Sato et al.
4,904,934 A    2/1990  Nishihashi et al.
4,923,407 A    5/1990  Rice et al.
4,985,676 A    1/1991  Karasawa
5,563,522 A *  10/1996 Abe ........................... 324/758
5,952,843 A    9/1999  Vinh
5,977,776 A *  11/1999 Huth et al. .................. 324/537
6,137,303 A    10/2000 Deckert et al.
6,276,956 B1   8/2001  Cook
6,356,093 B2   3/2002  Nishikawa et al.
6,411,079 B1   6/2002  Nishikawa
6,462,556 B2   10/2002 Yamashita et al.
6,853,207 B2 * 2/2005  Renfrow ...................... 324/756
6,856,156 B2 * 2/2005  Liang et al. ................. 324/758

FOREIGN PATENT DOCUMENTS

| | | |
|---|---|---|
| DE | 44 41 347 A1 | 5/1996 |
| GB | 2 240 435 | 7/1991 |
| WO | WO 99/23496 | 5/1999 |

* cited by examiner

*Primary Examiner*—Paresh Patel
(74) *Attorney, Agent, or Firm*—Laurence A. Greenberg; Werner H. Stemer; Ralph E. Locher

(57) ABSTRACT

The apparatus enables the automated testing, calibration and characterization of test adapters for semiconductor devices. A holder for the test adapter can be rotated in a defined manner. At least one probe head is provided which can be adjusted radially with respect to the holder. The probe head has two or more contact pins whose spacing distance is adjustable.

1 Claim, 4 Drawing Sheets

APPARATUS FOR THE AUTOMATED TESTING, CALIBRATION AND CHARACTERIZATION OF TEST ADAPTERS

CROSS-REFERENCE TO RELATED APPLICATION

This application is a continuation of application Ser. No. 09/931,686 now abandoned, filed Aug. 16, 2001.

BACKGROUND OF THE INVENTION

Field of the Invention

The present invention relates to an apparatus for automatically testing, calibrating and characterizing test adapters for semiconductor devices. The semiconductor devices are preferably integrated semiconductor circuits.

During the testing, calibration and characterization processes, the radio-frequency characteristics of the test adapters are investigated, in particular. However, it is also possible to investigate direct-current characteristics.

A test adapter may be, for example, what is referred to as a test card, by means of which semiconductor chips are tested at wafer level. Another example of a test adapter is a socket board, into which individual modules are introduced for testing.

In test systems for testing, say, semiconductor chips at wafer level, test cards are used, as is known, as test adapters. These test cards produce the electrical connection between contact points on the semiconductor chips in a wafer to be tested and at least one test channel in the test system. Reference is had, in this context, to FIG. 9 which shows a plan view of one possible exemplary arrangement of contact surfaces 2 in an edge area 3 of a motherboard of a test card 1. It should be understood, however, that other configurations of a test card are also feasible as an example of a test adapter. The contact surfaces 2 produce a contact with the test channels in the test system, and are preferably located on a number of circles with different radii in the edge region 3. A large number of contact needles are provided on the lower face of the test card 1, and are to fit such that they reliably make contact with the contact points on the chip at wafer level to be tested. These contact needles are preferably located in the inner area of the test card. In this case, each contact surface 2 has at least one associated contact needle. This means that the contact needles are electrically related with the associated contact surfaces 2 in a precisely defined manner.

In the socket boards mentioned initially, the contact surfaces 2 are arranged in the form of a square, rather than in the circular configuration above.

In general, test adapters such as test cards are matched to different semiconductor devices to be tested, that is, to their contact points. The appropriate different test adapters are therefore required for different types of semiconductor devices. The test adapters therefore make it possible to use the same test system even for different types of semiconductor devices.

We have, however, identified the fact that the electrical characteristics of the test adapters used for testing semiconductor devices have a considerable influence on the test results, and hence also on the test yield. In other words, the electrical calibration and/or characterization of test adapters is an important element, which should not be underestimated, in the analysis of an overall test system.

In the past, scarcely any investigations have been carried out into the influence of test adapters on various electrical parameters, such as line impedance, signal delay times, signal rise times or crosstalk between their various channels in different test systems, due to the large number of channels, which is currently around 1600 for test cards and will amount to 3200 in the near future. In other words, the influence of test adapters on signal performance and signal integrity in test systems has scarcely been considered so far.

In the current state of the art only a single appliance exists, which has not yet been described in any great detail, on the market, which allows semiautomatic measurement of the line impedance and of the signal delay times in test cards. In that case, electrical contact is made with the test card to be investigated via an interface board, which produces the connection between a test head of a test system and the test card even during normal operation of the test card. That appliance can therefore be used only with test systems provided with this interface board and not in general form for test cards for test systems with a different type of interface board, as well. Furthermore, only a relatively small subset of the channels can be measured automatically with the known appliance, as well. If it is intended to evaluate the channels of a different subset, then a manual change must be made to contact plugs for this subset. The measurement of crosstalk effects between the channels of different subsets is thus likewise impossible with the known appliance. Thus, until now, such a measurement could be carried out only manually and, due to the large number of channels, this was associated with an extremely long time penalty.

SUMMARY OF THE INVENTION

It is accordingly an object of the invention to provide an apparatus for automated testing, calibration and characterization of different test adapters, which overcomes the above-mentioned disadvantages of the heretofore-known devices and methods of this general type and which allows for any desired channels of the test adapter to be measured automatically.

With the foregoing and other objects in view there is provided, in accordance with the invention, an apparatus for automated testing, calibration and characterization of test adapters for semiconductor devices. The novel apparatus comprises:

a holder for holding a test adapter;

at least one probe head adjustably disposed relative to the holder, the probe head having two or more contact pins whose with an adjustable spacing distance therebetween; and an adjustment device configured to adjust the probe head relative to the holder.

In other words, the objects of the invention are achieved in the context of an apparatus of the type mentioned initially, by a holder for the test adapter and at least one probe head, which can be adjusted with respect to the holder and has at least two contact pins (whose spacing is adjustable).

The distance between the at least two contact pins on a probe head can be matched to the distance, which differs with different test adapters to be calibrated or wherein, between the contact surfaces for signals and the associated shields.

The holder can in this case hold test adapters with different diameters.

The apparatus according to the invention thus has, in particular, the holder which can rotate to hold test adapters with different diameters. This holders allows the test adapter to be rotated in a defined manner in the apparatus. A stepping motor or the like may be used as the drive for this rotation of the holder.

Furthermore, the apparatus according to the invention has one or more robot arms, which can be moved in a horizontal direction, running parallel to the plane of the test adapter, and also in a direction at right angles to this. In this case, a probe head is fit on each robot arm.

These robot arms and the rotation of the holder allow the probe heads and their contact pins to be positioned on the contact surfaces of the test adapter.

The apparatus can be matched directly to widely differing test adapters by appropriately controlling the position of the robot arms.

The rotation of the holder and the position of the robot arms and probe heads can be controlled from a central computer. This allows fully automated contact to be made with all channels, and a corresponding fully automated investigation to be carried out of the various electrical parameters of the test adapter.

The apparatus according to the invention can thus be matched directly to different test adapters and measurement tasks. Since, furthermore, it operates in a fully automated manner, it can carry out any desired electrical calibration and characterization of test adapters of widely differing types.

Other features which are considered as characteristic for the invention are set forth in the appended claims.

Although the invention is illustrated and described herein as embodied in an apparatus for automated testing, calibration and characterization of test adapters, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Reference is had to the detailed description of FIG. 9 appearing in the introductory text. The same reference symbols are used to identify the same and mutually corresponding components in the figures.

DESCRIPTION OF THE PREFERRED EMBODIMENTS

Figure 1:
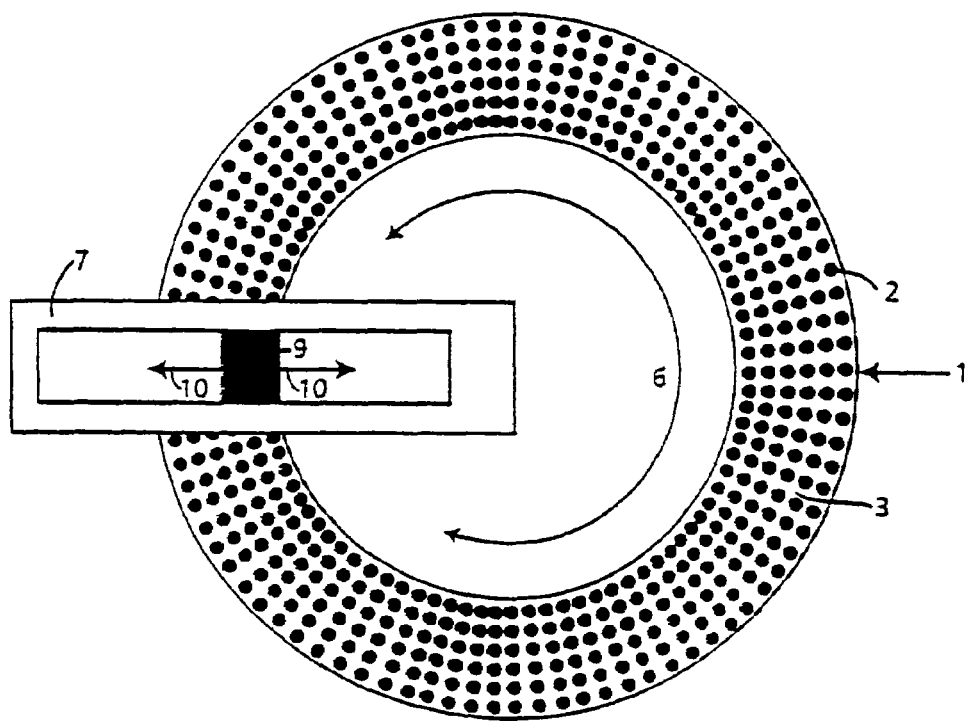
FIG. 1 is a plan view of a first exemplary embodiment of the apparatus according to the invention, having a robot arm with at least one probe head.
Figure 2:
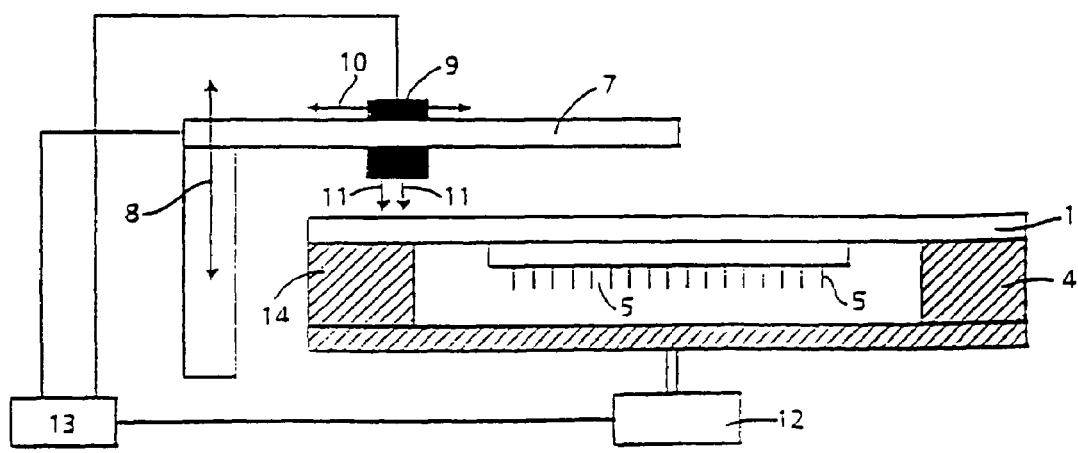
FIG. 2 is a schematic side view of the apparatus of FIG. 1.

Referring now to the figures of the drawing in detail and first, particularly, to FIGS. 1 and 2 thereof, there is shown a test card 1, as an example of a test adapter with contact surfaces 2 on its upper face and contact needles 5 on its lower face. The test card 1 is placed on a holder 4 of the apparatus, which can rotate as shown by a double arrow 6. The apparatus also has a robot arm 7, which can be moved as shown by a double arrow 8 in elevation and in its distance from the test card 1. A probe head 9 on this robot arm 7 can be moved in two directions, as shown by the double arrow 10. This probe head 9 has two contact pins 11, which can make contact with the contact surfaces 2 on the test card 1. The distance between these contact pins 11 can be adjusted, so that the apparatus can be matched to different types of test cards with different distances between the contact surfaces 2. If required, another probe head can also be provided on the robot arm 7.

The probe head 9 may also have more than two contact pins 10, if required. For example, it can thus be provided with four contact pins 11. It is even possible to equip the contact head 11 with enough contact pins 11 for it to be able to simultaneously touch all the contact surfaces 2 which are located one behind the other in the radial direction. In the example in FIG. 1, this would be six contact pins 11.

The holder 4 can be driven via a stepping motor 12. The stepping motor 12 is controlled by a central control unit 13, which also makes it possible to control and adjust the movement of the robot arm 7 and the position of the probe head 9, as well as the distance between the contact pins 11.

The holder 4 has an edge 14 which can be moved in the lateral direction, so that it is suitable for holding test cards with different diameters or else different test adapters.

The apparatus shown in FIGS. 1 and 2 is particularly suitable for measuring signal delay times and line impedances: this is because only the one robot arm 7 is required in this case. The measurement devices used for these measurements, such as network analyzers, oscilloscopes with TDR function (TDR=Time Domain Reflexion) and the like, generally have two channels, each with a signal and shield. The probe head 9 together with the two contact pins 11 which is fit on the robot arm 7 allows automatic measurement of all the channels on the test card 1 by moving the one contact pin 11 for a test signal into contact with a contact surface 2, while the other contact pin 11, which is used for grounding, is in contact, for example, with an adjacent contact surface 11. The desired electrical parameters, such as electrical losses, can be deduced from the delay time of the test signal reflected at the channel end, and from the magnitude of the reflected signal.

Figure 3:
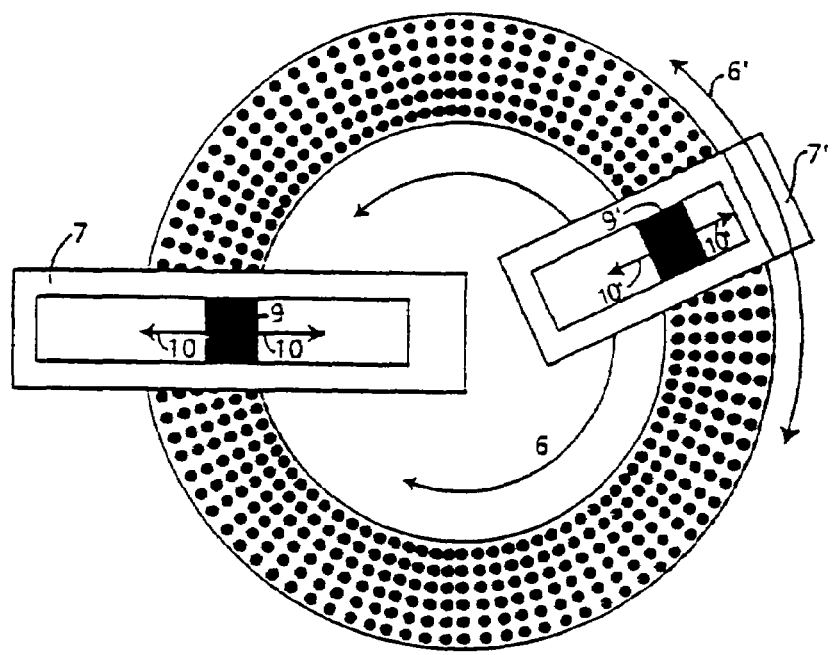
FIG. 3 is a plan view of a second exemplary embodiment of the apparatus according to the invention, having two robot arms, each having at least one probe head.
Figure 4:
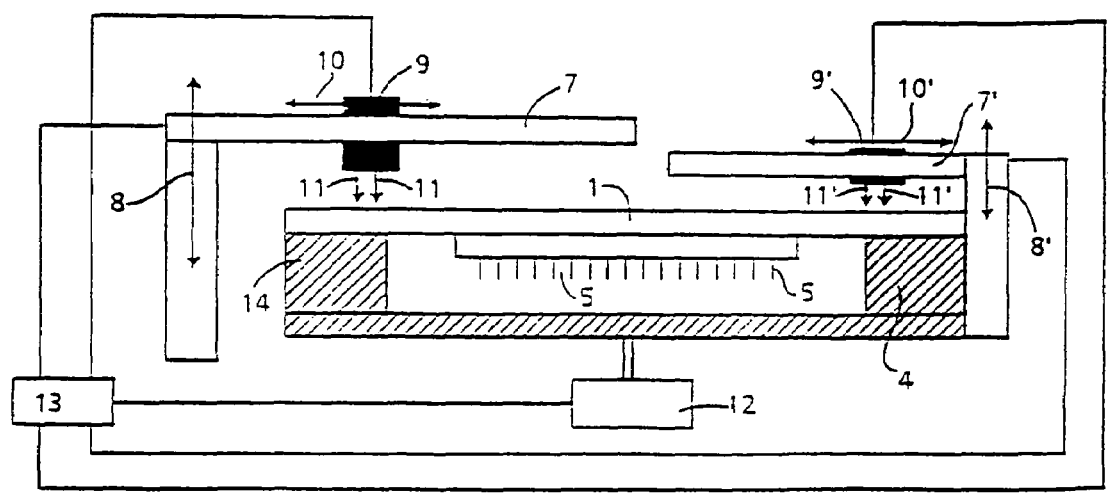
FIG. 4 is a schematic side view of the apparatus in FIG. 3.

FIGS. 3 and 4 show a further exemplary embodiment of the present invention, wherein a second robot arm 7' is provided with a second probe head 9' and with two further contact pins 11'. This second robot arm 7' can be adjusted in elevation (see the double arrow 8') in the same way as the robot arm 7, and can likewise be driven from the central control unit 13.

In addition, the position of the second robot arm 7' can be rotated with respect to the holder 4, as is indicated by a double arrow 6'.

In the exemplary embodiment shown in FIGS. 3 and 4, the control device 13 thus controls the stepping motor 12, the upward and downward movement of the robot arms 7 and 7' (see the double arrows 8 and 8'), the rotational movement of the robot arm 7' (see the double arrow 6' in FIG. 3) and the radial movement of the probe heads 9 and 9' (see the double arrows 10 and 10').

The exemplary embodiment in FIGS. 3 and 4 is particularly suitable for measuring crosstalk effects between different channels on the test card 1. This is because the aim of this measurement is to investigate the influence of the signals in two different channels on one another, wherein case each channel is intended to be considered together with every other channel, which leads to well over a million measurements when there are a large number of channels. The robot arm 7, which cannot rotate, with the probe head 9 is connected in a case such as this via the contact pins 11 to at least one channel to be investigated. The robot arm 7', which can rotate, with the probe head 9' is then connected via the contact pins 11' to all the other channels, so that the influence of all the channels on the channels mentioned above of the robot arm 7 can be investigated in one run. The probe head 9 is then connected via its contact pins 11 to the next channels, and the contact pins 10' on the probe head 9' are moved into contact with all the other channels. In this way, it is possible to measure successive crosstalk effects between each individual channel and all the other channels.

In the exemplary embodiment in FIGS. 3 and 4, the test card 1 can be rotated independently of the rotational movement of the robot arm 7'. If required, it is also possible to couple the rotary movement of the probe head 7' to the rotary movement of the holder 4.

The holder 4 is preferably designed such that it is suitable for holding different test adapters and test cards. To this end, the holder 4 may, for example, have adjustable outer edges 14 so that test adapters and test cards of different diameters can be inserted into the holder 4.

Figure 5:
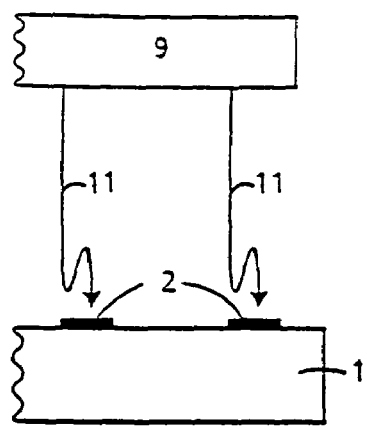
FIG. 5 is a schematic illustration to explain the configuration of contact pins for making contact with contact surfaces.
Figure 6:
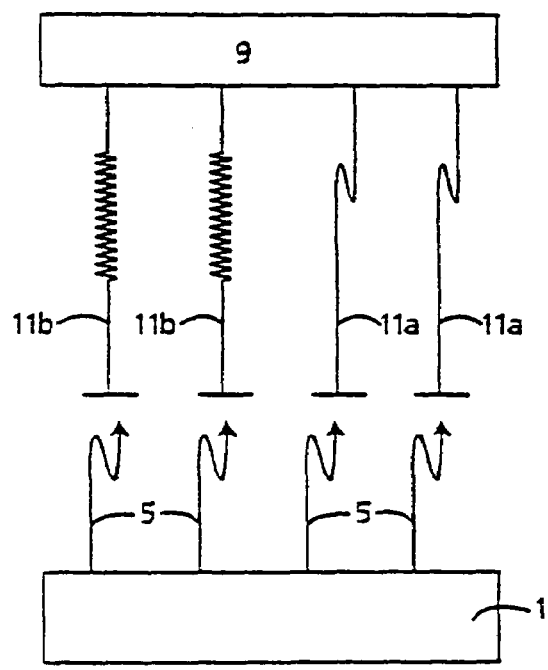
FIG. 6 is a schematic illustration to explain the configuration of contact pins for making contact with contact needles.
Figure 9:
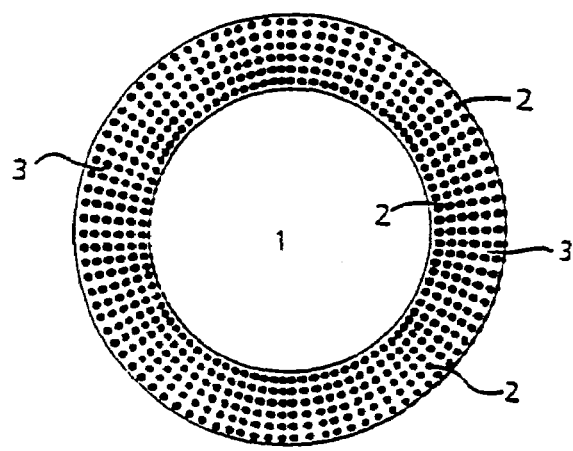
FIG. 9 is a plan view of contact surfaces in the edge area of a conventional test card.

FIGS. 5 and 6 show examples of possible configurations of the contact pins 11: as shown in FIG. 5, these may have pointed ends and may be sprung, so that these ends rest on the contact surfaces 2. However, it is also possible to provide contact pins 11*a*, 11*b* with flat ends (see FIG. 6), so that these flat ends can be moved into contact with the contact needles 5 of the test card 1 which is then inserted "reversed" into the holder 4. In order to spring out, the contact pins 11*a*, 11*b* may have a curved profile (see reference symbols 11 and 11*a* in FIGS. 5 and 6), or may be provided with a separate spring (see reference symbol 11*b* in FIG. 6).

Figure 7:
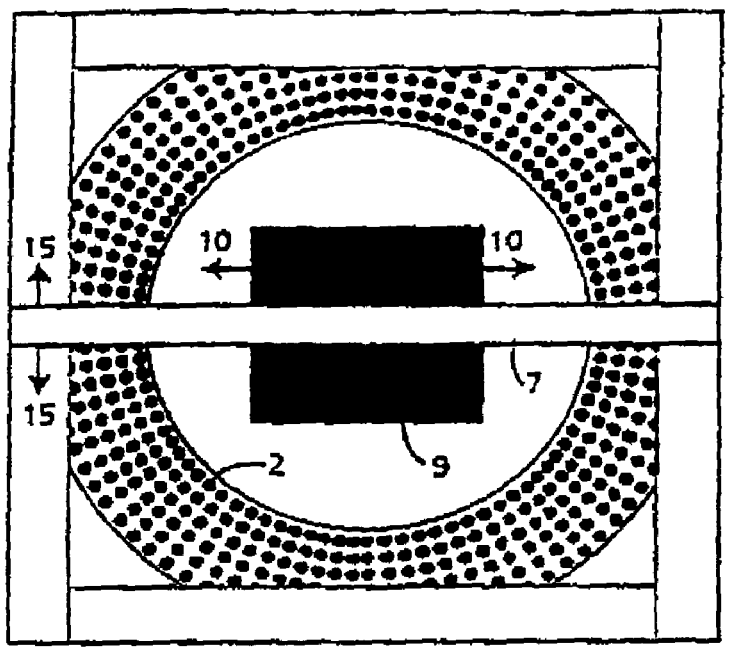
FIG. 7 is a plan view of a third exemplary embodiment of the apparatus according to the invention.
Figure 8:
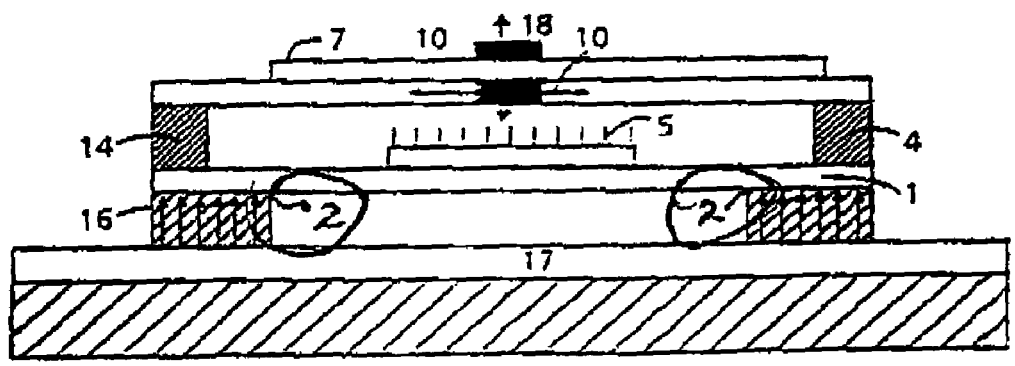
FIG. 8 is a schematic side view of the apparatus in FIG. 7.

FIGS. 7 and 8 show an exemplary embodiment wherein signals are supplied from a test system with an interface board 17 via contact pins 16 to the contact surfaces 2 of the test card 1, which has now been inserted "reversed", and are passed to the contact needles 5. The signals which are otherwise present on the chip are tapped off for analysis on these contact needles 5 by means of the springs illustrated in FIG. 6. In the present exemplary embodiment, the radial polar-coordinate robot arms 7 are replaced by a Cartesian (xyz) robot system which can be adjusted as shown by the arrows 10, 15 and 18. Such a configuration provides a square arrangement for the contact needles 5. This intrinsically allows the entire system to be analyzed.

We claim:

1. An apparatus for automated testing, calibration, and characterization of test adapters for semiconductor devices, comprising:
   a holder for holding a test adapter, said test adapter having contact surfaces and contact needles opposite said contact surfaces, said test adapter being inserted reversed in said holder causing said contact needles to extend upward;
   at least one probe head adjustably disposed relative to said holder, said probe head having at least two contact pins with an adjustable spacing distance therebetween, said contact pins being adapted to be brought in contact with said contact needles of said test adapter for testing said test adapter;
   an adjustment device configured to adjust said probe head relative to said holder; and
   an interface board disposed relative to said holder and opposite to said probe head, said interface board having contact pins configured to contact said contact surfaces on said test adapter.

* * * * *